United States Patent
Ye et al.

(10) Patent No.: US 7,715,193 B1
(45) Date of Patent: May 11, 2010

(54) ELECTRONIC DEVICE AND AIR REGULATION APPARATUS THEREOF

(75) Inventors: Zhen-Xing Ye, Shenzhen (CN); Lei Zheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/346,784

(22) Filed: Dec. 30, 2008

(30) Foreign Application Priority Data

Dec. 4, 2008 (CN) .................. 2008 1 0305964

(51) Int. Cl.
*H05K 7/22* (2006.01)
*H05K 5/00* (2006.01)
(52) U.S. Cl. .......... 361/695; 361/679.48; 361/694; 454/184; 454/347; 312/236
(58) Field of Classification Search .......... 361/679.46, 361/679.48, 690, 694–695; 137/825, 829, 137/833; 312/223.2, 236; 454/184, 347
See application file for complete search history.

(56) References Cited

U.S. PATENT DOCUMENTS

| | | | | |
|---|---|---|---|---|
| 4,760,773 A * | 8/1988 | Pezzulli | ...... | 454/358 |
| 5,820,235 A * | 10/1998 | Tsai | ...... | 312/223.2 |
| 6,735,079 B2 * | 5/2004 | Huang | ...... | 361/695 |
| 6,878,902 B2 * | 4/2005 | Lyle et al. | ...... | 219/209 |
| 2007/0053143 A1 * | 3/2007 | Kang | ...... | 361/678 |
| 2007/0243815 A1 * | 10/2007 | Lai | ...... | 454/184 |
| 2008/0112129 A1 * | 5/2008 | Kuo | ...... | 361/687 |
| 2009/0260874 A1 * | 10/2009 | Eckberg et al. | ...... | 174/650 |

* cited by examiner

*Primary Examiner*—Jayprakash N Gandhi
*Assistant Examiner*—Robert J Hoffberg
(74) *Attorney, Agent, or Firm*—Zhigang Ma

(57) ABSTRACT

An electronic device includes a chassis enclosing a fan and a sliding member. The chassis defines an air intake aligned with an inlet of the fan, and an opening. The sliding member is slidably mounted to the chassis and includes an operation part exposing through the opening. The sliding member is capable of either fully or partially covering and uncovering the air intake of the chassis via manipulating the operation part to slide in the opening.

11 Claims, 5 Drawing Sheets

ELECTRONIC DEVICE AND AIR REGULATION APPARATUS THEREOF

BACKGROUND

1. Technical Field

The present disclosure relates to electronic devices and, more particularly, to an electronic device having an air regulation apparatus.

2. Description of Related Art

An electronic device, such as a storage bridge bay (SBB), generally includes a plurality of components mounted thereto. The plurality of components is controlled by a control module and will generate a large quantity of heat during work. However, the plurality of components generally will not work synchronously, thus the control module will output several different powers according to the number of the components working at any given time. Therefore, several heat dissipation apparatuses need to be designed to satisfy different powers of the control module, which is costly.

DETAILED DESCRIPTION

Figure 1:
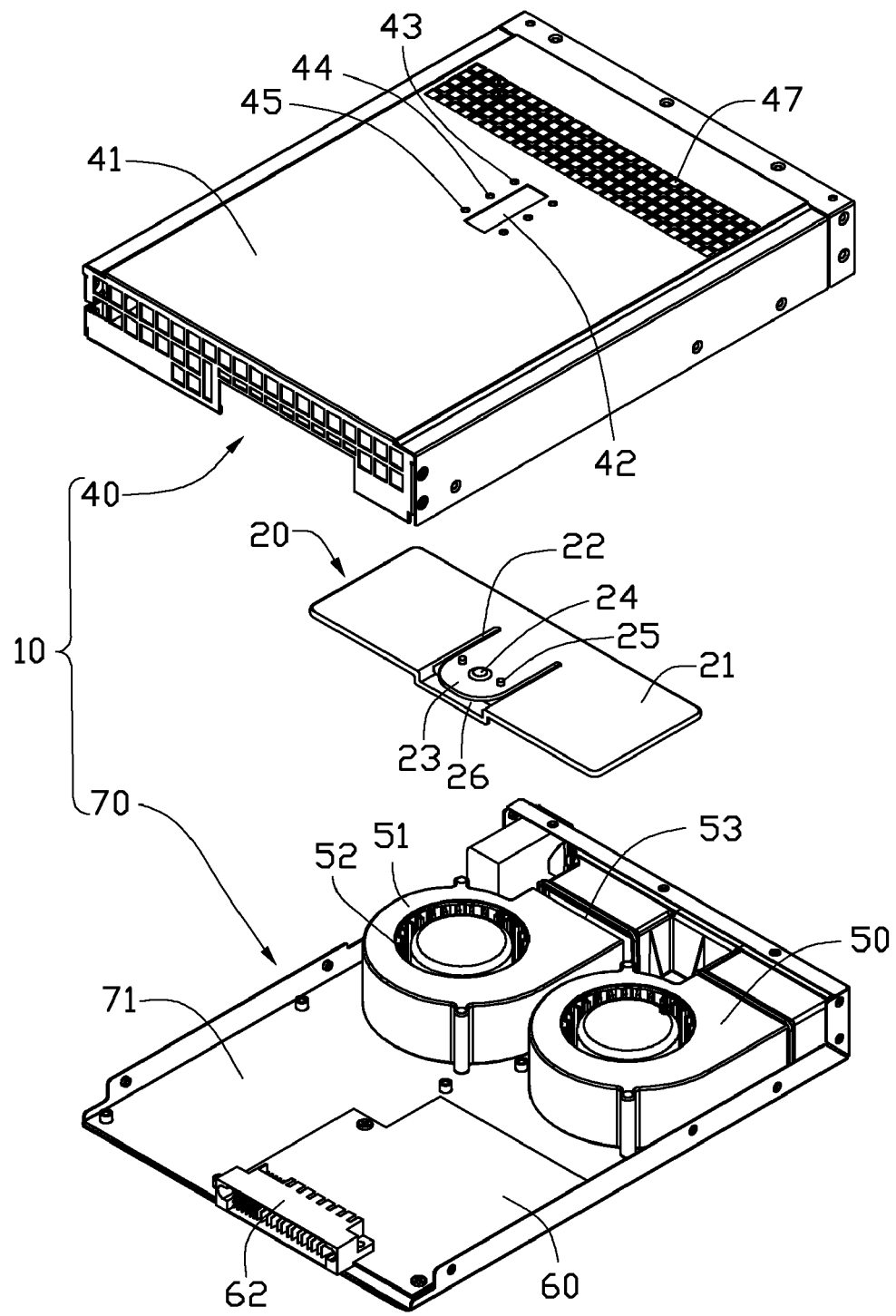
FIG. 1 is an exploded, isometric view of an exemplary embodiment of an electronic device, the electronic device including a chassis with a cover, and a sliding member.
Figure 2:
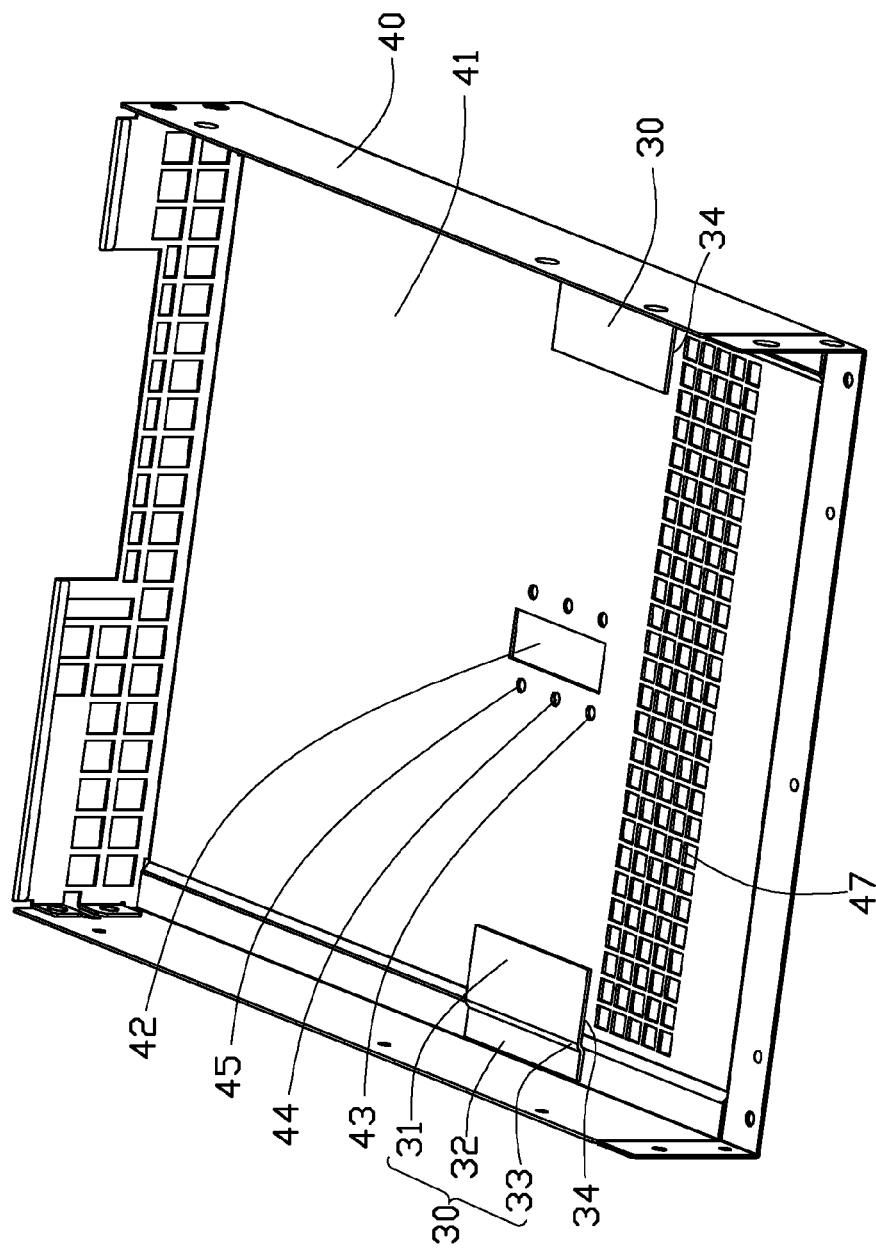
FIG. 2 is an inverted, enlarged view of the cover of FIG. 1.
Figure 3:
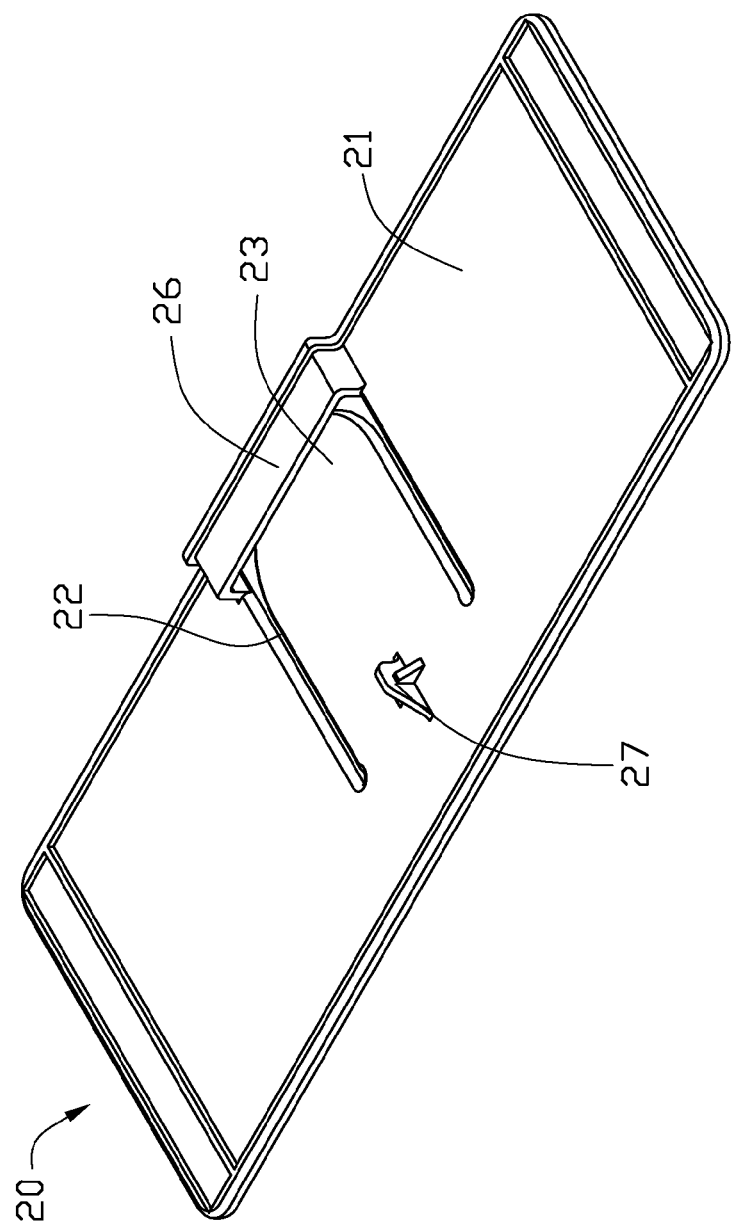
FIG. 3 is an inverted, enlarged view of the sliding member of FIG. 1.

Referring to FIGS. 1 to 3, an exemplary embodiment of an electronic device includes a chassis 10, a heat dissipation module 50 and a control module 60 mounted in the chassis 10, two guiding members 30, and a sliding member 20.

The chassis 10 includes a cover 40 and a base 70. The cover 40 includes a top wall 41 defining an air intake that includes a plurality of first vent holes 47 in an end of the top wall 41. A rectangular opening 42 is defined in the top wall 41 between the plurality of first vent holes 47 and an opposite end of the top wall 41 and adjacent to the plurality of first vent holes 47. Two first positioning holes 43 are defined in the top wall 41 at opposite sides of the opening 42 and adjacent to the plurality of first vent holes 47. Two second positioning holes 44 are defined in the top wall 41 at opposite sides of the opening 42. Two third positioning holes 45 are defined in the top wall 41 at opposite sides of the opening 42 and away from the plurality of first vent holes 47. Each second positioning hole 44 is located between a corresponding first positioning hole 43 and a corresponding third positioning hole 45. The base 70 includes a bottom wall 71 for supporting the heat dissipation module 50 and the control module 60, and an end wall 72 (labeled in FIGS. 4 and 5) perpendicularly extending from an end of the bottom wall 71. A plurality of second vent holes 73 (labeled in FIGS. 4 and 5) is defined in the end wall 72.

In this instant embodiment, the heat dissipation module 50 includes two fans mounted to the bottom wall 71 of the base 70. Each fan 51 includes an inlet 52 in the top of the fan 51, and an outlet 53 perpendicular to the inlet 52; and aligned with the plurality of second vent holes 73.

The control module 60 is mounted to the bottom wall 71 of the base 70 opposite to the end wall 72. An interface 62 extends from the control module 60, and is configured for connecting to other components (not shown) to control data storage devices (not shown) of the electronic device to communicate with the other components.

The guiding members 30 are mounted to opposite sides of the bottom of the top wall 41. Each guiding member 30 includes a fixing part 32 fixed to the top wall 41, a guiding part 31 parallel to and spaced from the top wall 41, and a connecting part 33 slantingly connected between the fixing part 32 and the guiding part 31. A receiving space 34 is defined between the top wall 41 and the guiding part 31. The guiding parts 31 of the guiding members 30 are opposite to each other.

The sliding member 20 includes a main body 21. The main body 21 defines two slots 22 therein, parallel to opposite ends of the main body 21, with a U-shaped elastic tab 23 formed between the slots 22. An operation part 24 extends up from a free end of the elastic tab 23. Two positioning posts 25 protrude up from the elastic tab 23, at opposite sides of the operation part 24. A reinforcing rib 27 extends down from a conjunction of the main body 21 and the elastic tab 23. A connecting tab 26 is defined to bridge over the slots 22, opposite to the conjunction of the main body 21 and the elastic tab 23.

Figure 4:
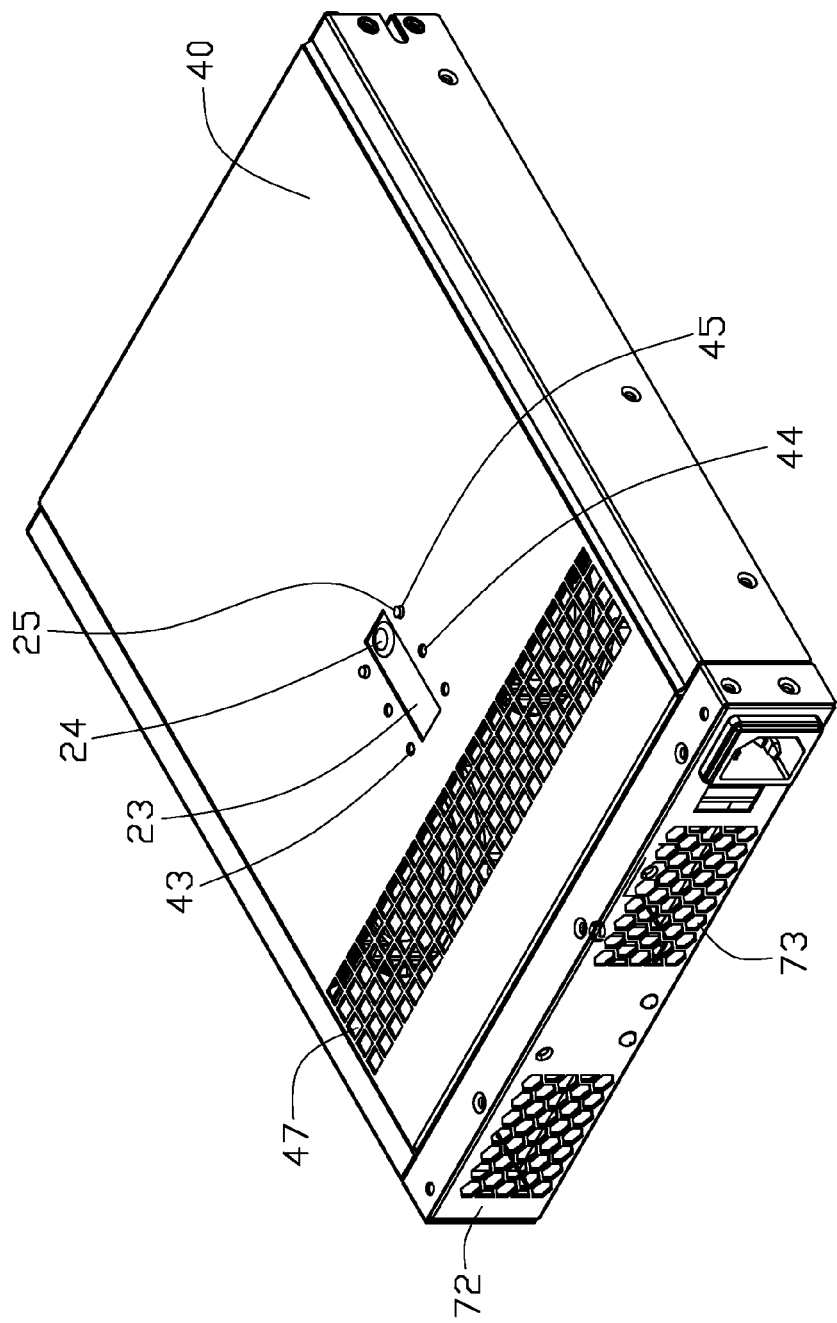
FIG. 4 is an assembled view of the electronic device of FIG. 1, but viewed from another perspective.
Figure 5:
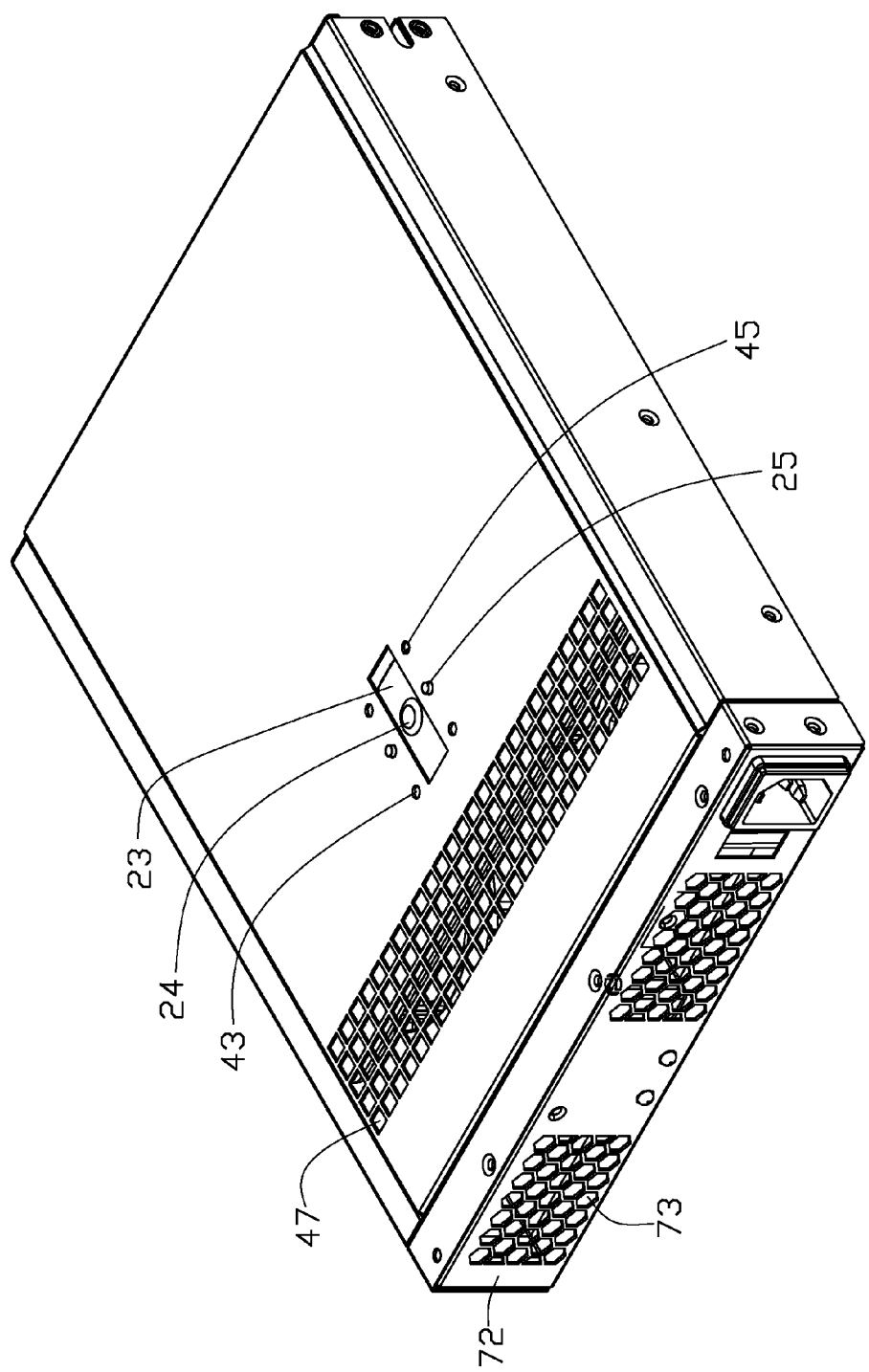
FIG. 5 is similar to FIG. 4, but showing the sliding member in a use state.

Referring to FIGS. 4 and 5, in assembly, the sliding member 20 is slidably mounted to the cover 40 of the chassis 10, via the opposite ends of the main body 21 slidably received in the corresponding receiving spaces 34 between the guiding parts 31 of the guiding members 30 and the cover 40. The elastic tab 23 covers the opening 42 of the cover 40. The operation part 24 is exposed through the opening 42 of the cover 40. The cover 40 is placed in position covering on the base 70 to enclose the heat dissipation module 50, the control module 60, and the data storage devices. The plurality of first vent holes 47 aligns with the inlets 52 of the fans 51 of the heat dissipation module 50.

In use, when the electronic device is not operating, the positioning posts 25 of the sliding member 20 are engaged in the first positioning holes 43 of the cover 40, and the main body 21 covers the plurality of first vent holes 47 to prevent foreign objects from entering into the electronic device. When the electronic device is operating at low power, such as 60 W, the operation part 24 is pressed downwardly to allow the elastic tab 23 to be resiliently deformed and the positioning posts 25 are removed from the first positioning holes 43. Thus, the main body 21 slides relative the cover 40, and with restoring force of the elastic tab 23, the positioning posts 25 are engaged in the second positioning holes 44 to make the main body 21 cover only parts of the plurality of first vent holes 47, to allow a small quantity of air to enter into the electronic device to dissipate heat. When the electronic device works at high power, such as 100 W, the positioning posts 25 are engaged in the third positioning holes 45 so that the main body 21 does not cover any of the plurality of first vent holes 47, to allow a large quantity of air to enter into the electronic device to dissipate heat. The plurality of second vent holes 73 is configured to allow heated air to be expelled from the electronic device.

In other embodiments, the first to third positioning holes 43-45 and the positioning posts 25 can be omitted, or more positioning holes can be defined in the cover 40, to create more positions the sliding member can be placed at, to satisfy different powers of the electronic device.

In this disclosure, the guiding members 30 and the sliding member 20 together form an air regulation apparatus to regulate input air of the electronic device.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. An air regulation apparatus for regulating input air of an electronic device that defines an air intake and an opening, the air regulation apparatus comprising:

two guiding members configured to be mounted in the electronic device; and a sliding member slidably mounted to the guiding members, the sliding member comprising an elastic tab exposed from the opening, a positioning structure being formed on the elastic tab to engage with the electronic device at a position, when the elastic tab is resiliently deformed via the opening to allow the positioning structure to remove from the position, the sliding member slides to allow the positioning structure to engage with the electronic device at other positions, and thereby the sliding member being configured to either fully or partially cover and uncover the air intake of the electronic device.

2. The air regulation apparatus of claim 1, wherein each guiding member comprises a fixing part configured to be fixed to the electronic device, a guiding part, and a slanting connecting part connected between the fixing part and the guiding part, wherein the guiding part is capable of forming a receiving space together with the electronic device, to slidably receive a corresponding end of the sliding member.

3. The air regulation apparatus of claim 2, wherein an operation part protrudes from the elastic tab for conveniently manipulating the sliding member to move to expose or close the air intake of the electronic device.

4. The air regulation apparatus of claim 3, wherein the positioning structure comprises two positioning posts protruding from the elastic tab, and are configured for engaging with the electronic device, to position the sliding member.

5. An electronic device comprising:

a chassis enclosing a fan, wherein the chassis defines an air intake aligned with an inlet of the fan, and an opening; and a sliding member slidably mounted to the chassis, wherein the sliding member comprises an elastic tab, an operation part formed on the elastic tab and exposing through the opening, and a positioning structure formed on the elastic tab;

wherein the sliding member slides to allow the positioning structure to selectively engage with the chassis at different positions with restoring force of the elastic tab and the sliding member is capable of alternatively covering and uncovering the air intake of the chassis, or covering part of the air intake of the chassis, via manipulating the operation part to slide in the opening.

6. The electronic device of claim 5, wherein the chassis comprises a base supporting the fan, and a cover covering the base to enclose the fan between the base and the cover; the air intake and the opening are defined in the cover, the sliding member is slidably mounted to an inner surface of the cover.

7. The electronic device of claim 6, wherein the base defines a plurality of vent holes aligned with an outlet of the fan.

8. The electronic device of claim 6, wherein the sliding member defines two parallel slots, allowing the elastic tab to be U-shaped between the slots.

9. The electronic device of claim 8, wherein a plurality of positioning holes is defined in the cover along a side of the opening, the positioning structure comprises a positioning post protruding up from the elastic tab, wherein the positioning post is selectively engaged in one of the plurality of positioning holes to position the sliding member.

10. The electronic device of claim 6, wherein two guiding members are mounted to the inner surface of the cover, for slidably receiving opposite ends of the sliding member.

11. The electronic device of claim 10, wherein each guiding member comprises a fixing part fixed to the inner surface of the cover, a guiding part parallel to the cover, and a connecting part slantingly connected between the fixing part and the guiding part, a receiving space is defined between the guiding part and the inner surface of the cover to slidably receive a corresponding end of the sliding member.

* * * * *